OR  3,936,140

United States
Ruell

[11] 3,936,140
[45] Feb. 3, 1976

[54] ARRANGEMENT FOR SEQUENTIAL DATA STORAGE

[75] Inventor: Hartwig Ruell, Otterfing, Germany

[73] Assignee: Siemens Aktiengesellschaft, Berlin & Munich, Germany

[22] Filed: July 31, 1974

[21] Appl. No.: 493,265

[30] Foreign Application Priority Data
Aug. 14, 1973  Germany............................ 2341140

[52] U.S. Cl............................ 350/3.5; 179/100.3 G
[51] Int. Cl.² .......................................... G03H 1/26
[58] Field of Search............... 350/3.5; 179/100.3 G; 178/6.7 R, 6.7 A

[56] References Cited
UNITED STATES PATENTS
3,776,995  12/1973  Little .................................. 350/3.5

Primary Examiner—Ronald J. Stern
Attorney, Agent, or Firm—Hill, Gross, Simpson, Van Santen, Steadman, Chiara & Simpson

[57] ABSTRACT

An apparatus for sequential data storage employing a coherent light source from which an object wave and a reference wave source symmetrical to one another are created, each wave being directed through a spherical lens and then a plane-parallel, transparent plate to a moving storage medium for recording. Each of the plane-parallel transparent plates may be fixed selectively either normal to the path of its respective wave or obliquely to the path.

3 Claims, 1 Drawing Figure

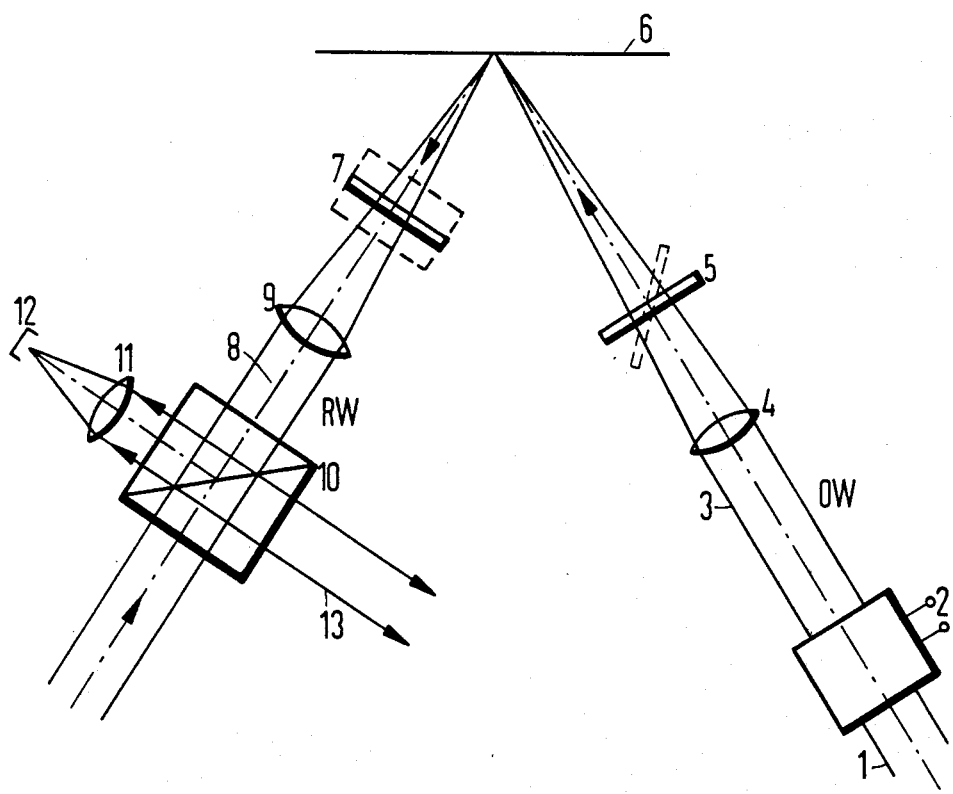

ARRANGEMENT FOR SEQUENTIAL DATA STORAGE

BACKGROUND OF THE INVENTION

1. Field of the Invention

The present invention is directed to an apparatus for recording data in the form either of one-dimensional holograms or of microscopic punctiform or dot-like changes on a storage medium.

2. Prior Art

The storage of information contained in the form of optical or other signals on a photosensitive storage medium, for example, a photosensitive tape, is well known, such as in film sound tracks. Holographic data storage and retrieval systems are also well known, and my joint co-pending application for patent, "An Apparatus For Producing One-Dimensional Holograms", filed July 11, 1974, U.S. Ser. No. 487,550, shows the use of a plane-parallel transparent plate disposed in the path of each of the object and reference waves at an angle of inclination to the axis of its respective wave so that each beam is spread by the plate into a pair of narrow focal lines. No prior art apparatus allows selective choice of hologram recording or nonholographic recording.

SUMMARY OF THE INVENTION

Non-modulated coherent light from a source is split into two beams, a reference beam or wave and an object beam or wave. The non-modulated object wave is passed through a modulator where data is encoded on the beam. Each wave then passes through a spherical lens and a plane-parallel transparent plate and is focused on a moving storage medium. Each of the two plane-parallel plates may be changed over between a position at right angles to the beam path for non-holographic recording and read out of data when the reference wave is suppressed and a position which is inclined relative to the beam path for the holographic recording and read out of data.

BRIEF DESCRIPTION OF THE DRAWING

The FIGURE shows an apparatus for the recording and read out of data in the form either of non-holographic punctiform changes on a storage medium or, by moving the plane-parallel transparent plates as shown, as one-dimensional holograms.

DESCRIPTION OF THE PREFERRED EMBODIMENT

In the figure source symmetrical coherent waves are shown at 3 and 8, the wave 3 being an object wave modulated from its continuous character at 1 by a modulator 2. The reference wave 8 is not modulated. The reference and object waves are provided from a single coherent light source by a conventional beam splitting device, neither of which are shown.

The object wave 3 passes through a spherical lens 4 and a plane-parallel plate 5 and is focused by the spherical lens 4 onto a moving storage medium 6. The reference wave 8 is focused at the same point on the moving storage medium 6 by a spherical lens 9 and passes through a second plane-parallel plate 7 between the spherical lens 9 and the moving storage medium 6.

A beam dividing cube 10 in the path of light reflected from the moving storage medium 6 at the focal point of the spherical lens 9 bounces that light through a third spherical lens 11 to a detector 12. The beam dividing cube 10 may also be used to split the original beam from a coherent light source into the reference wave 8 and the object wave 3, whereupon the wave 8 is transmitted by the beam divider and the wave 13 is reflected. The wave 13 would then be reflected a second time to be aligned with the modulator 2, spherical lens 4, etc., along the line of the non-modulated beam shown at 1.

For the recording of data in non-holographic dot form, and to read out such data, the plane-parallel plates 5 and 7 are employed in the position shown in solid lines in the figure at right angles to the optical axes of the respective waves 3 and 8. In the recording mode, a beam of coherent light 1 is modulated by the modulator 2 with the data which is to be recorded, and the spherical lens 4 focuses the beam on the moving storage medium 6 where it produces the recording. Reference wave 8 is of course suppressed by any convenient means for non-holographic recording or read-out of data. The plane-parallel plate has no substantial effect on the beam. Read out of the non-holographically recorded data is conducted by applying no modulation voltage to the modulator 2, so that the object wave 3 remains unmodulated. That beam is directed onto the storage medium 6 and its image is modulated thereby. The spherical lens 9 collects this reflected light and passes it to the beam divider 10; the spherical lens 11 passes this image onto the photodetector 12, where it is converted into an electric read-out signal.

For the recording of data in the form of one-dimensional holograms on the storage medium 6, the plane-parallel plates 5 and 7 are moved into the oblique positions across the beams shown by the broken lines in the figure. The plane-parallel plate 5 in the beam 3 is rotated about a vertical axis through the center of the beam, while the plane-parallel plate 7 is tilted about a horizontal axis through the center of the reference beam 8. The storage medium 6 is then illuminated from one angle by the modulated object wave 3, which modulation contains the data to be stored, and the storage medium 6 is simultaneously illuminated from a second angle by the reference beam 8. The oblique plane-parallel plates 5 and 7 cause the focal points of the spherical lenses 4 and 9 to be drawn out to form narrow focal lines which run at right angles to the propagation direction of the waves. Vertical focal lines thereby produced are arranged source symmetrically. The object wave and the reference wave each produce two focal lines which are at right angles to one another and which are spaced apart by a few hundred microns; the two horizontal focal lines coincide with one another upon the storage medium in the hologram thereby produced.

To reconstruct the holograms produced or to retrieve the information from the moving storage medium, the reference wave must be replaced by a reconstruction wave of the same geometry. It must be ensured that the settings of the plane-parallel plates 5 and 7 are accurately reproduced, and in particular the oblique position of each of the plane-parallel plates is critical.

Although various minor modifications might be suggested by those versed in the art, it should be understood that I wish to embody within the scope of the patent warranted hereon all such modifications as reasonably and properly come within the scope of my contribution to the art.

I claim as my invention:

1. In an apparatus for sequential data storage having a coherent light source from which a source symmetrical object wave and reference wave each are directed through one of two spherical lenses and through one of two corresponding plane-parallel, transparent plates onto a storage medium moving along a path, the improvement comprising:
   a beam divider in the path of the reference wave between said spherical lens and said source;
   each plane-parallel plate being selectively positionable in a first position normal to its respective wave for non-holographic recording and readout of data and in a second position which is inclined in relation to the wave for holographic recording and read-out of data; and
   each plane-parallel plate being swivelable between its said first and second positions about an axis normal to its respective wave and substantially through a center portion of said wave.

2. An apparatus for sequential data storage as defined in claim 1, further defined by the axis for inclination of the plane-parallel, transparent plate in the object wave being normal to the axis for inclination of the plane-parallel, transparent plate in the reference wave.

3. An apparatus for sequential data storage as defined in claim 1, further defined by the axis for inclination of the plane-parallel, transparent plate in the object wave being in a plane normal to the path of the moving storage medium and the axis for inclination of the plane-parallel, transparent plate in the reference wave being coplanar with said path.

* * * * *